US008867263B2

(12) United States Patent
Pelley

(10) Patent No.: US 8,867,263 B2
(45) Date of Patent: *Oct. 21, 2014

(54) MULTIPORT MEMORY WITH MATCHING ADDRESS AND DATA LINE CONTROL

(71) Applicant: Perry H. Pelley, Austin, TX (US)

(72) Inventor: Perry H. Pelley, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/740,862

(22) Filed: Jan. 14, 2013

(65) Prior Publication Data
US 2014/0198561 A1    Jul. 17, 2014

(51) Int. Cl.
G11C 11/412   (2006.01)
G11C 7/12     (2006.01)
G11C 7/18     (2006.01)

(52) U.S. Cl.
CPC ... *G11C 7/12* (2013.01); *G11C 7/18* (2013.01)
USPC .......................................... 365/154; 365/205

(58) Field of Classification Search
CPC ........................ G11C 13/0069; G11C 11/4091
USPC ..................................... 365/189.14, 205, 154
See application file for complete search history.

(56) References Cited

U.S. PATENT DOCUMENTS

| 5,335,199 | A  | * | 8/1994  | Aoyama ................. 365/230.05 |
| 5,384,734 | A  | * | 1/1995  | Tsujihashi et al. ....... 365/189.04 |
| 6,044,034 | A  | * | 3/2000  | Katakura ................ 365/230.05 |
| 6,181,634 | B1 |   | 1/2001  | Okita |
| 6,473,357 | B1 |   | 10/2002 | Fan et al. |
| 6,625,699 | B2 |   | 9/2003  | Cohen et al. |
| 6,816,955 | B1 |   | 11/2004 | Raza et al. |
| 6,845,059 | B1 |   | 1/2005  | Wordeman et al. |
| 6,873,565 | B1 |   | 3/2005  | Riedlinger et al. |
| 6,909,662 | B2 | * | 6/2005  | Sugiyama ............... 365/230.05 |
| 7,054,217 | B2 |   | 5/2006  | Yamada |
| 7,206,251 | B1 |   | 4/2007  | Yu |

(Continued)

FOREIGN PATENT DOCUMENTS

FR    2976114 A1    12/2012

OTHER PUBLICATIONS

U.S. Appl. No. 13/483,764, Pelley, P.H., et al., "Multi-Port Register File with Multiplexed Data", filed May 30, 2012.

(Continued)

*Primary Examiner* — Michael Tran
(74) *Attorney, Agent, or Firm* — James L. Clingan, Jr.; Joanna G. Chiu

(57) ABSTRACT

In a multiple port SRAM, a first bit cell is coupled to first and second word lines and a first and second bit line pair. A first data line pair is coupled to the first bit line pair via first switching logic. A second data line pair is coupled to the first bit line pair via second switching logic and to the second bit line pair via third switching logic. If a row address match but not a column address match exists between a first and second access address, the second switching logic selectively connects the second data line pair with the first bit line pair based on a first decoded signal generated from the column address of the second access address and the third switching logic decouples the second data line pair from the second bit line pair.

20 Claims, 4 Drawing Sheets

(56) References Cited

U.S. PATENT DOCUMENTS

| | | | |
|---|---|---|---|
| 7,533,222 | B2 | 5/2009 | Leung |
| 7,573,753 | B2 | 8/2009 | Atwood et al. |
| 7,808,847 | B2 | 10/2010 | Wang et al. |
| 7,894,296 | B2 | 2/2011 | Lee et al. |
| 7,940,599 | B2 | 5/2011 | Lu et al. |
| 2005/0270885 | A1 | 12/2005 | Masuo |
| 2008/0159051 | A1 | 7/2008 | Kato |
| 2011/0255361 | A1 | 10/2011 | Russell et al. |
| 2012/0051151 | A1 | 3/2012 | Wu et al. |

OTHER PUBLICATIONS

Endo, K., et al., "Pipelined, Time-Sharing Access Technique for an Integrated Multiport Memory", IEEE Journal of Solid-State Circuits, vol. 26, No. 4, Apr. 1991, pp. 549-554.

Johnston, C.T., et al., "FPGA implementation of a Single Pass Connected Components Algorithm", 4th IEEE International Symposium on Electronic Design, Test & Applications, May 2008, pp. 228-231.

Nii, K., et al., "Synchronous Ultra-High-Density 2RW Dual-Port 8T-SRAM with Circumvention of Simultaneous Common-Row-Access", IEEE Journal of Solid-State Circuits, vol. 44, No. 3, Mar. 2009, pp. 977-986.

Pilo, H., et al., "A 5.6ns Random Cycle 144Mb DRAM with 1.4Gb/s/pin and DDR3-SRAM Interface", ISSCC 2003/ Session 17/SRAM and DRAM/Paper 17.5, IEEE International Solid-State Circuits Conference, Feb. 12, 2003, 11 pgs.

Office Action mailed Feb. 26, 2014 in U.S. Appl. No. 13/740,868.

EP Application 14150651.9-1806, Extended Search Report mailed May 12, 2014.

EP Application 14150645.1-1806, Extended Search Report, mailed May 12, 2014.

\* cited by examiner

MULTIPORT MEMORY WITH MATCHING ADDRESS AND DATA LINE CONTROL

CROSS-REFERENCE TO RELATED APPLICATION

This application is related to U.S. patent application Ser. No. 13/740,868, filed on even date, titled "MULTIPORT MEMORY WITH MATCHING ADDRESS CONTROL," naming Perry Pelley as inventor, and assigned to the current assignee hereof.

BACKGROUND

1. Field

This disclosure relates generally to semiconductor devices, and more specifically, to multiport semiconductor memory devices.

2. Related Art

Along with recent advancements of semiconductor technologies, smaller-size and larger-capacity memories that allow high-speed reading/writing operations have been developed. Further, a so-called multiport memory including plural input ports and output ports has been used for reading/writing data of different addresses.

Multi-port memories, by providing access to the storage element of memory cells to more than one resource, such as in the case of multi-core processor or an interface between a processor and a bus, have become more commonly used. One of the issues with multi-port memories is how to coordinate this aspect of providing access to more than one resource. Often this ability is achieved using wait states and/or arbitration. This can result in unpredictable access times which is undesirable.

Accordingly there is a need for a multi-port memory that improves upon one or more of the issues discussed above.

BRIEF DESCRIPTION OF THE DRAWINGS

The present disclosure is illustrated by way of example and is not limited by the accompanying figs, in which like reference numbers indicate similar elements. Elements in the figures are illustrated for simplicity and clarity and have not necessarily been drawn to scale.

DETAILED DESCRIPTION

In one aspect, when a bit cell is selected by two ports, a bit line pair of one port is kept decoupled from the storage nodes of the selected memory cell and from its data line pair whereas the bit line pair of the other port is coupled to the storage nodes of the selected memory cell and to its data line pair and to the data line pair of the one port. Also the selected word line of the one port is kept disabled whereas the selected word line of the other port is enabled. Thus, the capacitance of the bit line pair of the one port is kept from adversely impacting the access to the selected bit cell whereas the bit line pair of the other port provides the needed access. Bit cell stability issues associated with simultaneous multiport access to a common bit cell are thus avoided. The bit line pair of the one port is coupled to the data line pair of the one port by column decoding. This is better understood by reference to the drawings and the following description.

Figure 1:
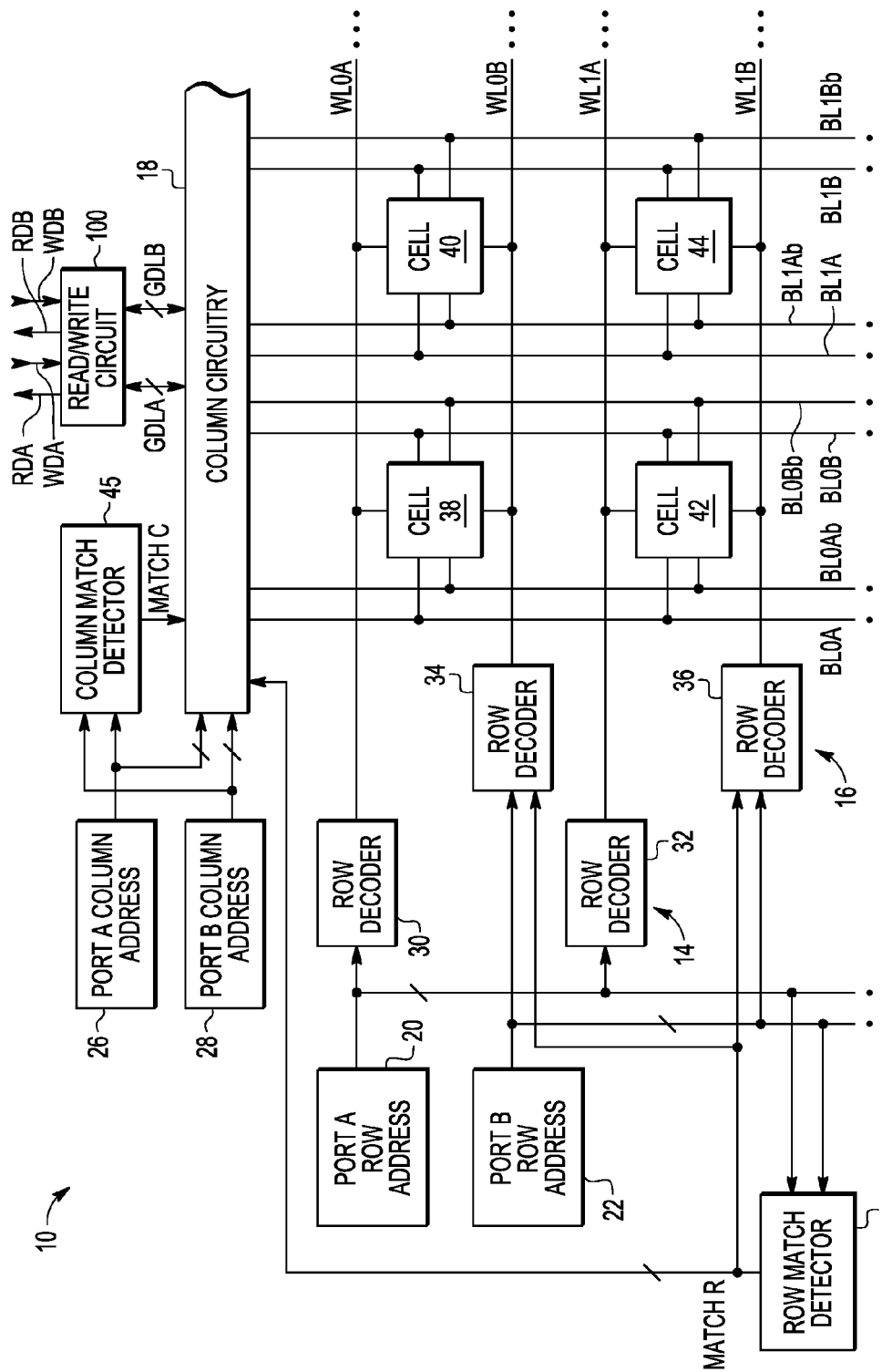
FIG. 1 is a block diagram of a first portion of a multi-port memory according to an embodiment.

Shown in FIG. 1 is a memory 10 having an array 12, a port A row decoder 14, a port B row decoder 16, column circuitry 18, port A row address buffer 20, a port B row address buffer 22, a row match detector 24, a port A column address buffer 26, a port B column address buffer 28, a column match detector 45, and a read/write circuit 100. Port A row decoder 14 comprises a row decoder 30 and a row decoder 32. Port B row decoder 22 comprises a row decoder 34 and a row decoder 36. Array 12 comprises bit cells 38, 40, 42, and 44.

Figure 4:
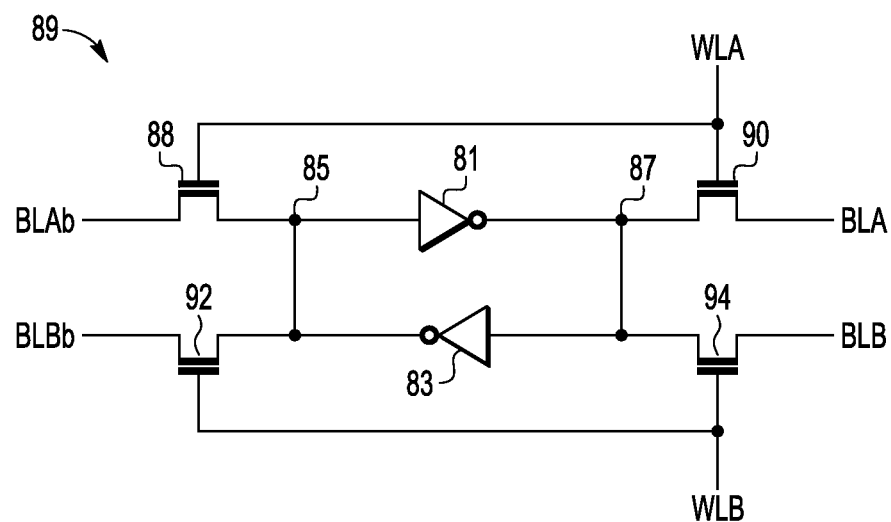
FIG. 4 is a circuit diagram of a memory cell of the first portion of the multi-port memory of FIG. 1.

Shown in FIG. 4 is a circuit diagram of an exemplary memory cell 89 which is exemplary for the other bit cells of array 12 such as memory cells 38, 40, 42, and 44. Bit cell 38, which is a static random access memory (SRAM) cell, comprises inverters 81 and 83 connected to nodes 85 and 87 and transistors 88, 90, 92, and 94 which are N channel transistors in this example. Inverter 80 has an input connected to node 85 and an output connected to node 87. Inverter 83 has an input connected to node 87 and an output connected node 85. Nodes 85 and 87 are storage nodes of memory cell 38. Transistor 88 has a first current electrode connected to node 85, a control electrode connected to word line WLA which is a port A word line, and a second current electrode connected to bit line BLAb which is a complementary bit line of port A. Transistor 90 has a first current electrode connected to node 87, a control electrode connected to word line WLA, and a second current electrode connected to bit line BLA which is a true bit line of port A. Transistor 92 has a first current electrode connected to node 85, a control electrode connected to a word line WLB, which is a word line of port B, and a second current electrode connected to complementary bit line BLBb of port B. Transistor 94 has a first current electrode connected to node 87, a control electrode connected to word line WLB, and true bit line BLB of port B. Nodes 85 and 87 are storage nodes that are accessed through transistors 88 and 92 for node 85 and transistors 90 and 94 for node 87. Inverters 81 and 83 together may be considered a storage latch. Transistors 90 and 88 are enabled when memory cell 89 is selected by port A and for coupling the storage nodes to the port A bit line pair. Transistors 92 and 94 are enabled when memory cell 89 is selected by port B. If memory cell 89 is selected by both port A and port B, transistors 88 and 90 are enabled and transistors 92 and 94 are kept disabled by deselecting word line WLB so that bit lines BLBb and BLB are kept isolated from storage nodes 85 and 87. In this example the bit lines are used for either writing to storage nodes 85 and 87 or reading from storage nodes 85 and 87. The word lines are for enabling the coupling between storage nodes and bit lines. The control electrodes of transistors 88, 90, 92, and 94 may be considered enable inputs and the second current electrodes may be considered access nodes.

Array 12 includes more than the four bit cells, which may be called memory cells, shown as memory cells 38, 40, 42, and 44 in FIG. 1 and accordingly more bit line pairs and word lines than shown. Memory cells 38 and 40 have a first enable input connected to word line WL0A and a second enable input connected to word line WL0B. The access nodes for port A of memory cell 38 are connected to true and complementary bit lines BL0A and BL0Ab, and the access nodes for port B are connected to true and complementary bit lines BL0B and BL0Bb. The access nodes for port A of memory cell 40 are connected to true and complementary bit lines BL1A and BL1Ab, and the access nodes for port B are connected to true and complementary bit lines BL1B and BL1Bb. Memory cells 42 and 44 have a first enable input connected to word line WL1A and a second enable input connected to word line WL1B. The access nodes for port A of memory cell 42 are connected to true and complementary bit lines BL0A and BL0Ab and the access nodes for port B are connected to true and complementary bit lines BL0B and BL0Bb. The access nodes for port A of memory cell 44 are connected to true and complementary bit lines BL1A and BL1Ab, and the access nodes for port B are connected to true and complementary bit lines BL1B and BL1Bb. Port A row address buffer 20 provides true and complementary signals of row address signals for port A. Port B row address buffer 22 provides true and complementary signals of row address signals for port B. Row decoders 30 and 32 are coupled to the combination of true and complementary address signals for port A. When row decoders 30 and 32 output a logic high, they select word line WL0A and WL1A, respectively. Row decoders 34 and 36 are coupled to the combination of true and complementary address signals for port B. When row decoders 34 and 36 are a logic high, they select word line WL0B and WL1B, respectively. Row match detector 24 is coupled to address buffers 20 and 22 and detects when they provide the same address and provides a true and a complement signals of a row match indicator MATCH R which is coupled to row decoders 34 and 36 that are associated with port B. When row addresses for port A and port B are the same, that means that the selected word lines for port A and port B would be the same row. When the row addresses match the MATCH R signal inhibits row decoders 34 and 36 resulting in word lines WL0B and WL1B being inactive. Consequently, only port A bit line pairs (BL0A, BL0Ab or, BL1A, BL1Ab) may be selected by the memory cells on WL0A or alternatively the memory cells on WL1A. In contrast, in normal operation with no row address match, one of word lines WL0A, WL1A and one of word lines WL0B, WL1B are both selected. As a result the bit lines in both ports coupled to the selected word lines of the corresponding port are activated by the memory cells coupled to the active word lines. That is, in normal operation both ports are active in array 12 so that a word line and bit lines are activated for both ports. Column circuitry 18 is coupled to bit lines BL0A, BL0Ab, BL0B, BL0Bb, BL1A, BL1Ab, BL1B, and BL1Bb, selects among these bit lines, senses data at the selected bit lines, and couples the sensed data to global data lines GDLA for port A and GDLB for port B in response to column addresses provided by port A column address buffer 26 and port B column address buffer 28. True and complementary bit lines of the same port connected to the same column of cells may be referenced as a bit line pair. For example, bit lines BL0A and BL0Ab form a bit line pair. Similarly, data lines DLA and DLAb shown in FIG. 2 may be referenced as a data line pair.

Figure 2:
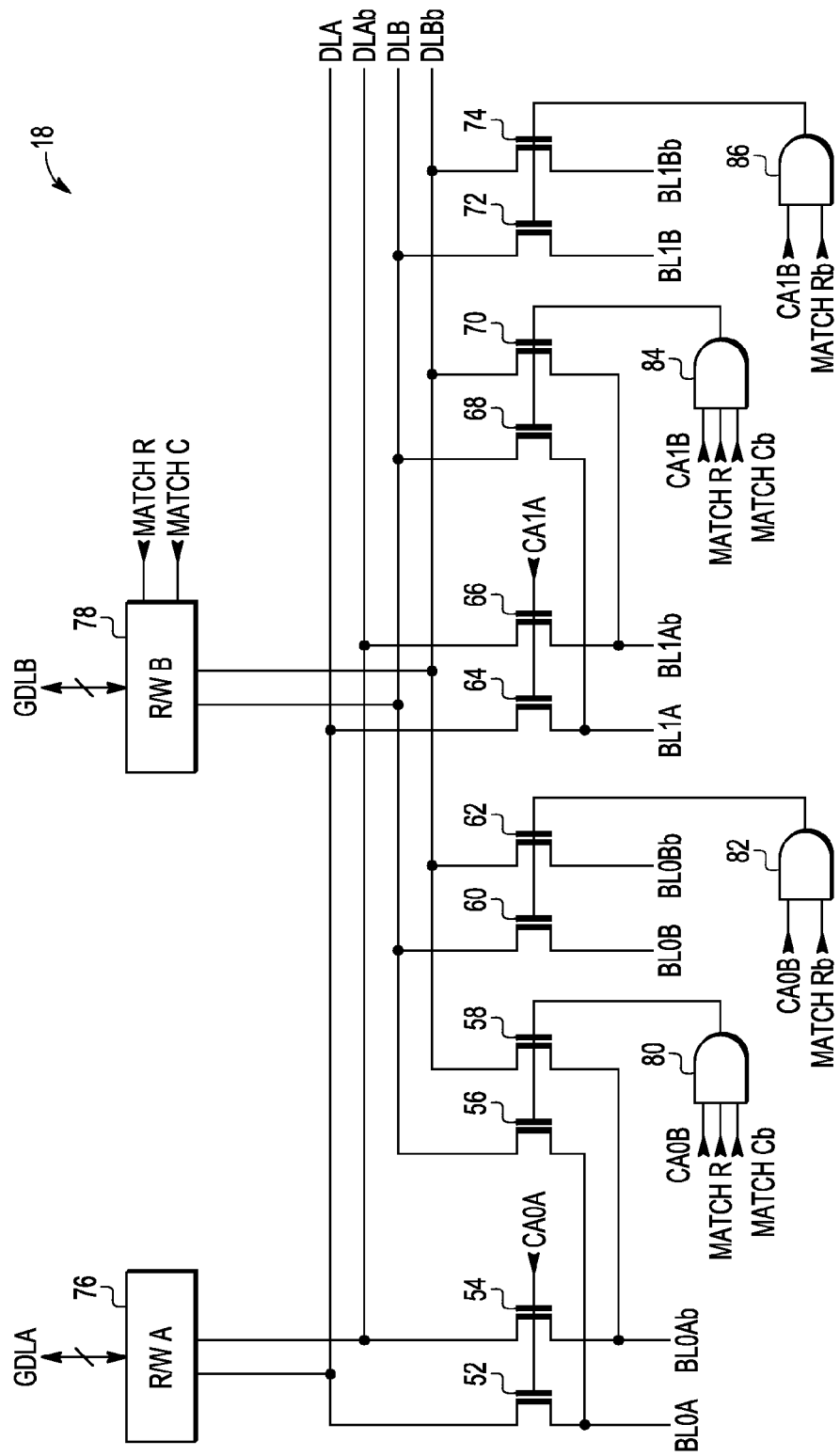
FIG. 2 is a combination circuit, logic, and block diagram of a portion of the first portion of the multi-port memory of FIG. 1.

Shown in FIG. 2 is column circuitry 18 in more detail. Column circuitry 18 comprises transistors 52, 54, 56, 58, 60, 62, 64, 66, 68, 70, 72, and 74, a read/write (R/W) A buffer 76 for port A, a R/W B buffer 78 for port B, AND gates 80, 82, 84, and 86. Column circuitry 18 less the R/W A buffer 76 and R/W B buffer 78 may be referenced as switching logic. Signals CA0A, CA0B, CA1A, and CA1B result from decoding the port A column address for signals CA0A and CA1A and result from decoding the port B column address for signals CA0B and CA1B and may referenced as a column address signal or a column decode signal. Transistor 52 has a first current electrode connected to bit line BL0A, a control electrode for receiving a column address signal CA0A for port A, and a second current electrode coupled to a true data line DLA for port A that is coupled to R/W A buffer 76. Transistor 54 has a first current electrode connected to bit line BL0Ab, a control electrode for receiving column address signal CA0A, and a second current electrode connected to a complementary data line DLAb that is coupled to R/W A buffer 76. Transistor 60 has a first current electrode connected to bit line BL0B, a control electrode connected to an output of AND gate 80, and a second current electrode coupled to a true data line DLB for port B that is coupled to R/W B buffer 78 for port B. Transistor 62 has a first current electrode connected to bit line BL0Bb, a control electrode connected to the output of AND gate 82, and a second current electrode coupled to a complementary data line DLBb for port B that is connected to R/W B buffer 78 for port B. Transistor 60 has a first current electrode coupled to BL0B, a control electrode coupled to output of NAND gate 82 and a second control electrode coupled to data line DLB. Thus when there is not a row match and the column address CA0$b$ is asserted, transistors 60 and 62 become conductive so that bit lines BL0B and BL0Bb are coupled to data lines DLB and DLBb, respectively, through transistors 60 and 62, respectively. Transistor 64 has a first current electrode connected to bit line BL1A, a control electrode for receiving a column address CA1A for port A, and a second current electrode coupled to true data line DLA for port A that is coupled to R/W A buffer 76. Transistor 66 has a first current electrode connected to bit line BL1Ab, a control electrode for receiving column address CA1A, and a second current electrode connected to complementary data line DLAb that is coupled to R/W A buffer 76. Transistor 72 has a first current electrode connected to bit line BL1B, a control electrode connected to an output of AND gate 86, and a second current electrode coupled to true data line DLB for port B that is connected to R/W B buffer 78 for port B. Transistor 74 has a first current electrode coupled to BL1Bb, a control gate coupled to the output of NAND gate 86, and a second current electrode coupled to data line DLBb. AND gate 86 has a first input for receiving a column address CA1B for port B and a second input for receiving complementary row match indicator match Rb that is provided by row match detector 24 when it detects that the port A and the port B row addresses are different. As previously described for complementary row match indicator match Rb, when a match has not been detected, complementary row match indicator match Rb is a logic high so that column address signal CA1B for port B is passed to the control gate of transistors 72 and 74. Thus, when column address CA1B is asserted transistors 72 and 74 become conductive so that bit lines VL1B and BL1Bb are coupled to data lines DLB and DLBb, respectively, through transistors 72 and 74, respectively.

Transistor 56 has a first current electrode connected to bit line BL0A which is for port A, a control electrode connected to the output of AND gate 80, and a second current electrode coupled to data line DLB which is for port B that is connected to R/W B buffer 78 for port B. Transistor 58 has a first current electrode connected to complementary bit line BL0Ab which is for port A, a control electrode connected to the output of AND gate 80, and a second current electrode coupled to complementary data line DLBb which is for port B that is connected to R/W B buffer 78 for port B. AND gate 80 has a first input for receiving column address signal CA0B which is for port B, row match indicator match R, and complementary column match indicator MATCH Cb. When the column addresses for ports A and B match complementary column match indicator MATCH Cb is a logic low thus when there is a column address match, AND gate 80 is forced to provide a logic low output which causes transistors 56 and 58 to be non-conductive. When the row addresses for ports A and B do not match, row match indictor MATCH R is a logic low which also forces AND gate 80 to provide a logic low. Thus, when the row addresses do not match, the output of AND gate 80 is a logic low and transistors 56 and 58 are non-conductive. On the other hand when there is no column match but there is a row match, MATCH R and MATCH Cb are both a logic high and MATCH CB are both a logic high so that the output of AND gate 80 follows column address signal CA0B. Thus for the case where there is a row match but not a column match the access for port B is with the port A bit line pair as selected by the port B column address. In such case Transistors 56 and 58 are conductive and couple the pair of port A bit lines BL0A and BL0Ab to port B data lines DLB and DLBb so that the port B R/WB circuit may write to or read from the port A bit line pair.

Transistor 68 has a first current electrode connected to bit line BL1A which is for port A, a control electrode connected to the output of AND gate 84, and a second current electrode coupled to data line DLB which is for port B that is connected to R/W B buffer 78 for port B. Transistor 70 has a first current electrode connected to complementary bit line BL1Ab which is for port A, a control electrode connected to the output of AND gate 84, and a second current electrode coupled to complementary data line DLBb which is for port B that is connected to R/W B buffer 78 for port B. AND gate 84 has a first input for receiving column address signal CA1B which is for port B, row match indicator match R, and complementary column match indicator MATCH Cb. Similarly as for AND gate 80, when the column addresses for ports A and B match complementary column match indicator MATCH Cb is a logic low thus when there is a column address match, AND gate 84 is forced to provide a logic low output which causes transistors 68 and 70 to be non-conductive. When the row addresses for ports A and B do not match, row match indictor MATCH R is a logic low which also forces AND gate 84 to provide a logic low. Thus, when the row addresses do not match, the output of AND gate 80 is a logic low and transistors 68 and 70 are non-conductive. On the other hand when there is no column match but there is a row match, MATCH R and MATCH Cb are both a logic high so that the output of AND gate 80 follows column address signal CA0B. Thus for the case where there is a row match but not a column match and the access for port B is through the port A bit line as selected by the port B column address. When there is row match but not a column match, the Port B data line pair DLB, DLB0 is coupled to a different bit line pair than the bit line pair accessed by port A and coupled to the data line pair DLA, DLAb. Consequently each addressed bit line pair of port A is coupled to only one data line pair, either DLA, DLAb or DLB, DLBb. As stated before all of the bit lines of port B are disconnected under row address match conditions.

Figure 3:
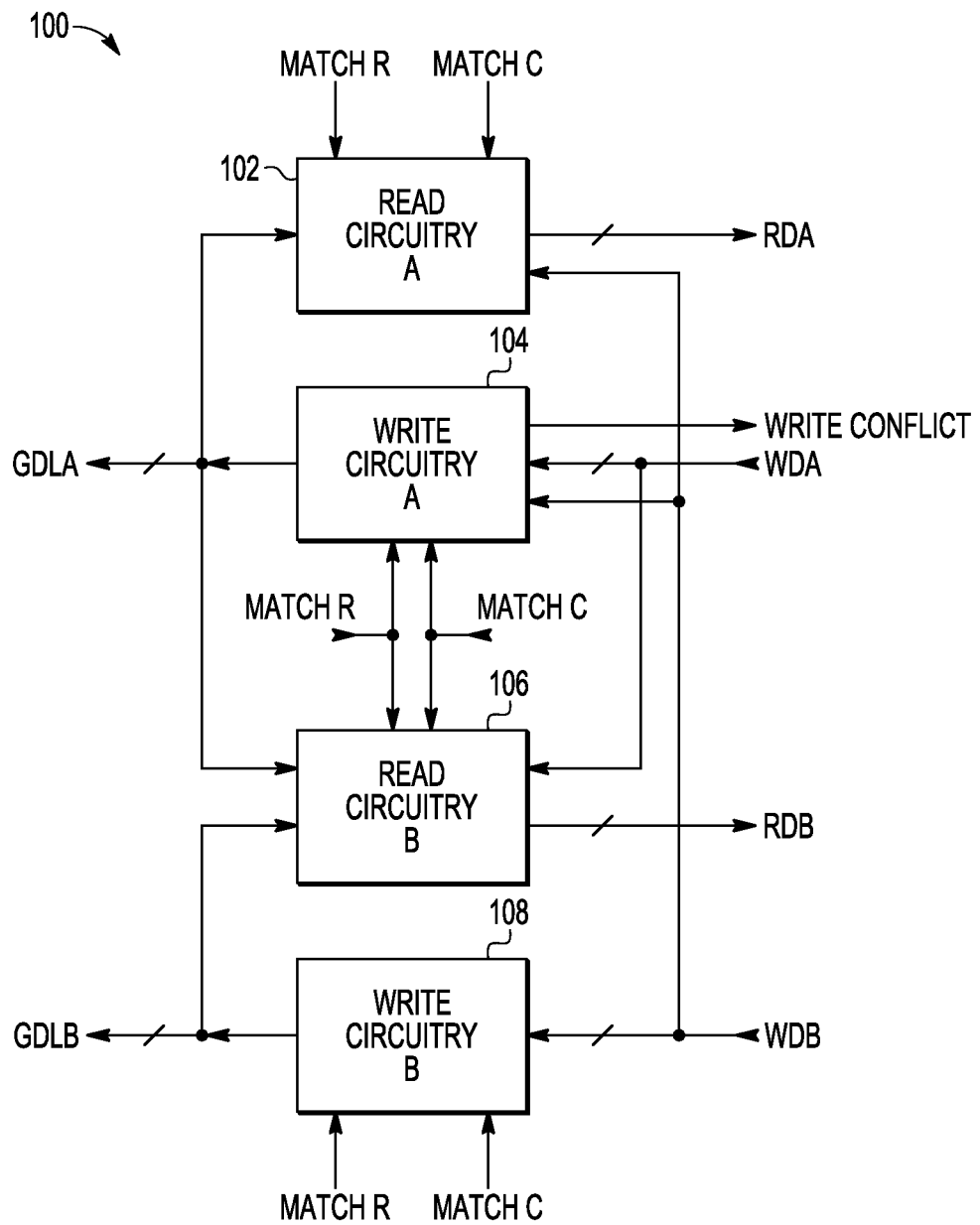
FIG. 3 is a block diagram of a second portion of the multi-port memory of FIG. 1 according to the embodiment.

Shown in FIG. 3 is read/write circuit 100 coupled to global data lines GDLA and GDLB for ports A and B, respectively, comprising read circuitry 102 for port A, write circuitry 104 for port A, read circuitry 106 for port B, and write circuitry 108 for port B. Read circuitry 102 has an input coupled to global data lines GDLA and a read output RDA for outputting data that has been read for port A. Write circuitry 104 has an output coupled to global data lines GDLA and a write input WDA for receiving data that is to be written for port A. Read circuitry 106 has an input coupled to global data lines GDLB and read output RDB for outputting data that has been read for port B. Write circuitry 108 has an output coupled to global data lines GDLB and a write input WDB for receiving data that is to be written for port A. Read circuitry 102 further has an input coupled to write input WDB, an input for receiving match R, and an input for receiving match C. Write circuitry 104 further has an input coupled to write input WDB, an input for receiving match R, and an input for receiving match C. Read circuitry 106 further has an input coupled to write input WDA, an input for receiving match R, and an input for receiving match C.

For a read in the case where the row addresses for ports A and B are different, data present on the bit lines is selectively coupled to data line pair DLA and DLAb and data line pair DLB and DLBb from port A bit lines and port B bit lines, respectively. The selection is made by column address signals CA0A and CA1A for port A and column address signals Ca0B and CA1B for port B. The row decoder selected by the port A row address enables its word line, and the row decoder selected by the port B address enables its word line. MATCH R is not asserted because the row addresses for ports A and B are different so none the row decoders are disabled due to match R. As stated previously, more memory cells than those shown are present and similarly there are more bit line pairs and word lines and thus the corresponding selection signals for column selection and row selection. The description is focused on the selection and non-selection relating to the shown signals such as Ca0A, Ca1A, Ca0B, and Ca1B for column selection and WL0A, WL1A, WL0B, and WL1B for row selection. R/W A buffer 76 and R/W B buffer 78 each include a sensing circuit and a write driver. For a read, R/W A buffer 76 and R/W B buffer 78 sense the data present on data line pair DLA and DLBb and data line pair DLB and DLBb, respectively. After sensing, the data is provided on global data lines GDLA and GDLB. For writing, data is received on global data lines GDLA and GDLB. The data is then written by R/W A buffer 76 and R/W B buffer 78 onto data line pair DLA and DLAb and data line pair DLB and DLBb, respectively. The bit lines are selected for a write in the same manner as for a read. In this example, the selection is a one of two selection. The bit line pair associated with a column address is the bit line pair selected for normal operation in which the row addresses for port A and B are different. For port A, column address CA0A is associated with bit line pair BL0A and BL0Ab, and column address CA1A is associated with bit line pair BL1A and BL1Ab. For port B, column address CA0B is associated with bit line pair BL0B and BL0Bb, and column address CA1B is associated with bit line pair BL1B and BL1Bb. For a write, R/W A buffer 76 and R/W B buffer 78 receive the data to be written from global data lines GDLA and GDLB, respectively. R/W A buffer 76 writes the received data onto data line pair DLA and DLAb. R/W B buffer 78 writes the data onto data line pair DLB and DLBb. Selected columns couple the data on the data lines to their bit lines. For example, if bit lines BL0A and BL0Ab are to be written for port A, then transistors 52 and 54 are made conductive by column address signal CA0A being asserted at a logic high. Similarly, if bit lines BL1B and BL1Bb are to be written for port B, column address signal CA1B is asserted and transistors 72 and 74 are conductive to provide data onto the selected bit line pair of BL1B and BL1Bb.

In the case of a read or write where row addresses match and the column addresses do not match, MATCH R is a logic high so that MATCH Rb is a logic low forcing AND gates 82 and 86 to provide a deasserted output at a logic low. Thus even if column address signal CA1$b$ is a logic high, the transistors 72 and 74 are non-conductive but then AND gate 84 provides a logic high output due to MATCH R being a logic high and MATCH Cb being a logic high. MATCH Cb, the complement of MATCH C, is a logic high to indicate that a column match has not occurred. With the output of AND gate 84 at a logic high, transistors 68 and 70 couple bit line pair BL1A and BL1Ab, which are port A bit lines, to data lines DLB and DLBb, which are port B data lines. Thus the bit cell being read or written on port B is read or written by the port B R/W B buffer 78 through port A bit lines, bit line pair BL1A and BL1*b*. With MATCH R being a logic high, the selected port B row decoder is disabled. Thus for example, if row decoders 30 and 34 of FIG. 1 are both selected then row match detector asserts MATCH R which is received by port B row decoder 34 disabling the port B decoder. With the port B row decoders disabled, then no word lines of port B are enabled with the result that the memory cells along the selected row are coupled to port A bit lines only so that the memory cells along the selected row are subjected to the capacitance of only the port A bit line pair and not the port B bit line pair. This has the effect though of the port B data being written or read not being present on the port B bit lines. Thus, the port B data is accessed through pass transistors that are connected to the port B data lines and the port A bit line pair line pair of the column selected by the port B address. Port A operates normally in that the bit line pair of the column selected by the port A address is coupled to the port A data lines, data lines DLA and DLAb.

For the case where both the column addresses for ports A and B and the row addresses for ports A and B are the same, both port A and port B are addressing the same memory cell. For both a read and a write, the access to the port B bit lines is blocked. The only access to the memory cells is through the port A data lines and port A bit lines. A write to either port A or Port B is accomplished through write circuitry 104 to GDLA and read/write circuit 76 through data line pair DLA, DLAb and bit line pair BL0A, BL0Ab or BL1A, Bl1Ab to the selected memory cell. R/W B buffer 78 is not used in case of both ports addressing the same memory cell. Port A operation for R/W A buffer 76, the row decoders, the bit lines, and the data lines does not change based on the row or column addresses being the same or different. In all of these cases, port A accesses the memory cells through the port A data lines, bit lines, and word lines. With or without either row or column match, one port may read or write independently of the other port reading or writing. Each condition depending on a row or column match or lack of match has been described above. In a given memory access a selected memory cell will read or written, but not both, through the bit lines of only one port so no conflicts arise causing a logic fault or a wait state arise. However, the well known potential of write coupling to read bit lines to the detriment of read data must be dealt with by using design techniques known in the art.

READ/Write Circuit 100 of FIG. 3 responds in different ways depending on MATCH C, MATCH R, and depending if either port A or port B is writing For the cases where either the column address or row addresses are different or both are different, port A reads from or writes through to the global data line GDLA to R/W A circuit 76 and port B reads from or writes to R/W circuit 78 through global data line GDLB. For a read on port A, read circuitry A 102 receives the data on global data line GDLA, provides the needed buffering and timing, and provides an output RDA as the output of port A. Similarly for port B, read circuitry B 106 responds to the data provided on global data line GDLA by providing an output RDB for port B. In the case of the column addresses being different but the row addresses being the same, the data is coupled from the port A bit line pair that is in the column selected by the port B column address to the port B data line pair. Thus R/W B buffer 78 provides the data for port B to global data line GDLB in the same manner as for the cases when the row addresses are different. Similar for a write, data is received as write data WDA by write circuitry A 104 and write data WDB by write circuitry B 108. This data is then provided to global data lines GDLA and GDLB buffered and timed as needed by write circuitry A 104 and write circuitry B 108, respectively.

In another case both row and column address match and MATCH R and MATCH C are asserted to a logic high indicating that both ports are addressing the same bit cell. In the case of a write, only one port may be writing to a common memory cell. Both ports attempting to write with both MATCH R and a MATCH C asserted high is a logic fault and no write occurs. Additionally, the WRITE CONFLICT signal is asserted as notice of an illegal write attempt. In the case where both the row addresses and the column addresses match, all reading and writing is done for both ports is done though global data line GDLA from and to R/W A circuit 76 of FIG. 2 Write for either port A or port B is done through Port a Write Circuitry A 104 to global Data line GDLA. Write data WDB for port B is always received by both Write circuitry A and Write Circuitry B, when present, but is output by only one of the two write circuitries depending on whether the row and column addresses both match.

While Write Circuitry A 104 normally writes write data WDA to global data line GDLA, for the case where both the row and column addresses are the same Write Circuitry A 104 writes write data WDB when port B is writing. In this case Write Circuitry B 108 is inactive. When there is a row address match and a column address match, write data from either port is written to the reading port read output register in the place of the read data from the global data lines. For example when port B is writing, write data WDB is written to the Read circuitry A 102 output register in the place of the read data from the global data lines so it can be outputted as read data RDA For a read with a row address match and a column address match, data is received on only global data line GDLA and is read by both read circuitry A 102 and read circuitry B 106. Because the access for port A and port B is for the same memory cell, the data needs to only come from one global data line. Read circuitry 102 and 106 provide the data as read signals RDA and RDB, respectively, timed and buffered as needed. Global data line GDLB remains inactive during this read. The read is only made on the selected memory cell on the port A bit line pair. In this case, it is not necessary to couple the bit line pair to the port B data line pair because the data is the same for port A and port B. Thus, only the selected bit line pair of Port A is coupled to only one data line pair DLA, DLAb, thereby avoiding having the capacitance of two bit line or two data lines being coupled to the memory cell. This is particularly important during a read and is important in keeping the read times the same regardless of what combination of column and row addresses is provided. Another benefit is minimizing power consumed by switching a minimized data path Thus it is shown that a technique for accessing a multiple port memory can achieve avoiding adding capacitance that would normally occur when two ports are accessing along the same row. Accessing along the same row can easily result in multiple bit lines being coupled to the same memory cell. This adds capacitance which can slow down reading especially.

It is apparent by now that a multiple port static random access memory (SRAM) having a first port and a second port has been disclosed. The multiple port SRAM includes a first word line and a second word line of a plurality of word lines. The multiple port SRAM includes a first bit line pair, a second bit line pair, a third bit line pair, and a fourth bit line pair of a plurality of bit line pairs. The multiple port SRAM includes an array of bit cells coupled to the plurality of word lines and the plurality of bit line pairs, wherein the array of bit cells includes a first bit cell having a first storage latch, and coupled to the first word line and the first bit line pair to access the first storage latch, and coupled to the second word line and the second bit line pair to access the first storage latch and a first read/write data line pair of a first plurality of read/write data line pairs for accessing the array of bit cells, and a second read/write data line pair of a second plurality of read/write data line pairs for accessing the array of bit cells. The SRAM has a further characterization by which the first read/write data line pair is coupled to the first bit line pair via first switching logic and the second read/write data line pair is coupled to the first bit line pair via second switching logic and coupled to the second bit line pair via third switching logic. The multiple port SRAM includes a row match detector which provides a row match indicator based on whether a row address of a first access address matches a row address of a second access address. The multiple port SRAM includes a column match detector which provides a column match indicator based on whether a column address of the first access address matches a column address of the second access address, wherein in response to the row match indicator indicating a match and the column match indicator not indicating a match, the second switching logic selectively connects the second read/write data line pair with the first bit line pair based on a first decoded signal generated from the column address of the second access address and the third switching logic decouples the second read/write data line pair from the second bit line pair. The multiple port SRAM may have a further characterization by which, in response to the row match indicator not indicating a match, the third switching logic selectively connects the second read/write data line pair with the second bit line pair based on the first decoded signal generated from the column address of the second access address. The multiple port SRAM may have a further characterization by which, in response to the row match indicator not indicating a match, the second switching logic decouples the second read/write data line pair from the first bit line pair. The multiple port SRAM may have a further characterization by which the first switching logic selectively connects the first read/write data line pair with the first bit line pair based on a first decoded signal generated from the column address of the first access address. The multiple port SRAM may have a further characterization by which the array of bit cells includes a second bit cell having a second storage latch, and coupled to the first word line and the third bit line pair to access the second storage latch, and coupled to the second word line and the fourth bit line pair to access the second storage latch, wherein the first read/write data line pair is coupled to the third bit line pair via fourth switching logic, and the second read/write data line pair is coupled to the third bit line pair via fifth switching logic, and coupled to the fourth bit line pair via sixth switching logic; the fourth switching logic selectively connects the first read/write data line pair with the third bit line pair based on a second decoded signal generated from the column address of the first access address, and, in response to the row match indicator indicating a match and the column match indicator not indicating a match, the fifth switching logic selectively connects the second read/write data line pair with the third bit line pair based on a second decoded signal generated from the column address of the second access address and the sixth switching logic decouples the second read/write data line pair from the fourth bit line pair. The multiple port SRAM may have a further characterization by which, in response to the row match indicator not indicating a match, the sixth switching logic selectively connects the second read/write data line pair with the fourth bit line pair based on the second decoded signal generated from the column address of the second access address. The multiple port SRAM may have a further characterization by which, in response to the row match indicator not indicating a match, the fifth switching logic decouples the second read/write data line pair from the third bit line pair. The multiple port SRAM may have a further characterization by which, in response to both the row match indicator indicating a match and the column match indicator indicating a match, read/write circuitry coupled to the second read/write data line pair is disabled. The multiple port SRAM may have a further characterization by which. The multiple port SRAM may have a further characterization by which, if the first word line is activated based on the first access address and both the row match indicator indicates a match and the column match indicator indicates a match, the first read/write data line pair selectively accesses the first bit cell based on a first decoded signal generated from the column address of the first access address and the second word line is disabled. The multiple port SRAM may have a further characterization by which, in response to the first word line being activated based on the first access address, the first decoded signal generated from the column address of the first access address being asserted, and both the row match indicator indicating a match and the column match indicator indicating a match, the multiple port SRAM is further characterized by if the first access address and the second access address each correspond to a read access, the first read/write data line pair provides read data from the first bit cell, and the read data is provided to both the first port and the second port, if the first access address corresponds to a write access, the first port receives write data which is provided by the first read/write data line pair to the first bit cell and is provided to the second port as read data, and if the second access address corresponds to a write access, the first port receives write data which is provided by the first read/write data line pair to the first bit cell and is provided to the first port as read data. The multiple port SRAM may further include first row decode circuitry coupled to a first subset of the plurality of word lines, including the first word line, wherein the first row decode circuitry activates a word line of the first subset based on the first access address and second row decode circuitry coupled to a second subset of the plurality of word lines, including the second word line, wherein the first subset and the second subset are mutually exclusive. The multiple port SRAM may have a further characterization by which, when the row match indicator does not indicate a match, the second row decode circuitry activates a word line of the second subset based on the second access address and when the row match indicator indicates a match, the second row decode circuitry is disabled, in which the second word line is disabled. The multiple port SRAM may have a further characterization by which, when the row match indicator does not indicate a match, the first plurality of read/write data line pairs accesses a first set of bit cells of the array of bit cells in response to the first access address, and the second plurality of read/write data line pairs accesses a second set of bit cells of the array of bit cells, mutually exclusive of the first set of bit cells, in response to the second access address. The multiple port SRAM may have a further characterization by which the access of the first plurality of read/write data line pairs occurs simultaneously with the access of the second plurality of read/write data line pairs.

Also disclosed is method for accessing a multiple port SRAM having a plurality of word lines, a plurality of bit line pairs, and a plurality of bit cells coupled to the plurality of word lines and the plurality of bit line pairs, wherein each of the plurality of bit cells is coupled to a first bit line pair and a second bit line pair of the plurality of bit line pairs and a first word line and a second word line of the plurality of word lines. The method includes providing a first access address and a second access address to the multiple port SRAM. The method further includes, if the row match indicator indicates a match and the column match indicator does not indicate a match, deactivating the second word line for each bit cell of the plurality of bit cells, for each bit cell selected by the first access address, using a first read/write data line pair of the multiple port SRAM to access the bit cell selected by the first access address using the first bit line pair and the first word line. The method further includes for each bit cell selected by the first access address, using a first read/write data line pair of the multiple port SRAM to access the bit cell selected by the first access address using the first bit line pair and the first word line, for each bit cell selected by the second access address, using a second read/write data line pair of the multiple port SRAM to access the bit cell selected by the second access address using the first bit line pair and the first word line, and decoupling the second read/write data line pairs from the second bit line pairs of the plurality of bit cells. The method further includes if the row match indicator does not indicate a match, for each bit cell selected by the first access address, using the first read/write data line pair to perform a read or write access to the bit cell selected by the first access address using the first bit line pair and the first word line and for each bit cell selected by the second access address, using the second read/write data line pair to perform a read or write access the bit cell selected by the second access address using the second bit line pair and the second word line. The method further includes if both the row match indicator indicates a match and the column match indicator indicates a match, if the first access address and the second access address each correspond to a read access, using the first read/write data line pair to access read data from bit cells selected by the first access address, and providing the read data as read data outputs at each of a first port and a second port of the multiple port SRAM, if the first access address corresponds to a write access, receiving write data at the first port, providing the received write data as the read data output at the second port, and using the first read/write data line pair to store the received write data to bit cells selected by the first access address, and if the second access address corresponds to a write access, receiving write data at the first port, providing the received write data as the read data output at the first port, and using the first read/write data line pair to store the received write data to bit cells selected by the first access address.

Disclosed also is a multiple port static random access memory (SRAM) having a first port for receiving a first access address and a second port for receiving a second access address including a row match detector which provides a row match indicator based on whether a first row address derived from the first access address matches a second row address derived from the second access address. The multiple port SRAM further includes a column match detector which provides a column match indicator based on whether a first column address derived from the first access address matches a second column address derived from the second access address. The multiple port SRAM further includes a first bit cell having a first storage latch, and coupled to a first word line, a first true bit line, and a first complementary bit line to access the first storage latch, and coupled to a second word line, a second true bit line, and a second complementary bit line to access the first storage latch. The multiple port SRAM further includes a second bit cell having a second storage latch, and coupled to the first word line, a third true bit line, and a third complementary bit line to access the second storage latch, and coupled to the second word line, a fourth true bit line, and a fourth complementary bit line to access the second storage latch. The multiple port SRAM further includes a first data line pair, wherein the first true bit line and first complementary bit line is coupled to the first data line pair via first switching logic that is responsive to a first column decode signal generated from the first access address. The multiple port SRAM further includes a second data line pair, wherein the first true bit line and first complementary bit line is coupled to the first data line pair via second switching logic that is responsive to a first logical combination of a first column decode signal generated from the second access address, a row match indicator, and a column match indicator, and wherein the second true bit line and the second complementary bit line are coupled to the second data line pair via third switching logic that is responsive to a second logical combination of the first column decode signal generated from the second access address and the row match indicator. The multiple port SRAM may have a further characterization by which the second switching logic connects the first true bit line and first complementary bit line to the second data line pair when the first column decode signal generated from the second access address is asserted, the row match indicator indicates a match, and the column match indicator does not indicate a match, and otherwise decouples the first true bit line and first complementary bit line from the second data line pair and the third switching logic connects the second true bit line and the second complementary bit line to the second data line pair when the first column decode signal generated from the second access address is asserted and the row match indicator does not indicate a match, and otherwise decouples the second true bit line and the second complementary bit line from the second data line pair. The multiple port SRAM may have a further characterization by which the first switching logic connects the first true bit line and the first complementary bit line to the first data line pair when the first column decode signal generated from the first access address is asserted, and decouples the first true bit line and the first complementary bit line from the first data line pair when the first column decode signal generated from the first access address is not asserted.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure is described herein with reference to specific embodiments, various modifications and changes can be made without departing from the scope of the present disclosure as set forth in the claims below. For example the invention was described in the context of two ports, it may be applied to memory architectures in which there are more than two ports. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A multiple port static random access memory (SRAM) having a first port and a second port, comprising:
   a first word line and a second word line of a plurality of word lines;
   a first bit line pair, a second bit line pair, a third bit line pair, and a fourth bit line pair of a plurality of bit line pairs;
   an array of bit cells coupled to the plurality of word lines and the plurality of bit line pairs, wherein the array of bit cells comprises:
      a first bit cell having a first storage latch, and coupled to the first word line and the first bit line pair to access the first storage latch, and coupled to the second word line and the second bit line pair to access the first storage latch;
   a first read/write data line pair of a first plurality of read/write data line pairs for accessing the array of bit cells, and a second read/write data line pair of a second plurality of read/write data line pairs for accessing the array of bit cells, wherein:
      the first read/write data line pair is coupled to the first bit line pair via first switching logic; and
      the second read/write data line pair is coupled to the first bit line pair via second switching logic and coupled to the second bit line pair via third switching logic;
   a row match detector which provides a row match indicator based on whether a row address of a first access address matches a row address of a second access address; and
   a column match detector which provides a column match indicator based on whether a column address of the first access address matches a column address of the second access address, wherein in response to the row match indicator indicating a match and the column match indicator not indicating a match, the second switching logic selectively connects the second read/write data line pair with the first bit line pair based on a first decoded signal generated from the column address of the second access address and the third switching logic decouples the second read/write data line pair from the second bit line pair.

2. The multiple port SRAM of claim 1, wherein in response to the row match indicator not indicating a match, the third switching logic selectively connects the second read/write data line pair with the second bit line pair based on the first decoded signal generated from the column address of the second access address.

3. The multiple port SRAM of claim 2, wherein in response to the row match indicator not indicating a match, the second switching logic decouples the second read/write data line pair from the first bit line pair.

4. The multiple port SRAM of claim 3, wherein the first switching logic selectively connects the first read/write data line pair with the first bit line pair based on a first decoded signal generated from the column address of the first access address.

5. The multiple port SRAM of claim 1, wherein the array of bit cells comprises:
   a second bit cell having a second storage latch, and coupled to the first word line and the third bit line pair to access the second storage latch, and coupled to the second word line and the fourth bit line pair to access the second storage latch;
   wherein the first read/write data line pair is coupled to the third bit line pair via fourth switching logic, and the second read/write data line pair is coupled to the third bit line pair via fifth switching logic, and coupled to the fourth bit line pair via sixth switching logic;
   wherein the fourth switching logic selectively connects the first read/write data line pair with the third bit line pair based on a second decoded signal generated from the column address of the first access address, and
   wherein in response to the row match indicator indicating a match and the column match indicator not indicating a match, the fifth switching logic selectively connects the second read/write data line pair with the third bit line pair based on a second decoded signal generated from the column address of the second access address and the sixth switching logic decouples the second read/write data line pair from the fourth bit line pair.

6. The multiple port SRAM of claim 5, wherein in response to the row match indicator not indicating a match, the sixth switching logic selectively connects the second read/write data line pair with the fourth bit line pair based on the second decoded signal generated from the column address of the second access address.

7. The multiple port SRAM of claim 6, wherein in response to the row match indicator not indicating a match, the fifth switching logic decouples the second read/write data line pair from the third bit line pair.

8. The multiple port SRAM of claim 1, wherein in response to both the row match indicator indicating a match and the column match indicator indicating a match, read/write circuitry coupled to the second read/write data line pair is disabled.

9. The multiple port SRAM of claim 1, wherein if the first word line is activated based on the first access address and both the row match indicator indicates a match and the column match indicator indicates a match:
   the first read/write data line pair selectively accesses the first bit cell based on a first decoded signal generated from the column address of the first access address, and
   the second word line is disabled.

10. The multiple port SRAM of claim 9, wherein in response to:
   the first word line being activated based on the first access address,
   the first decoded signal generated from the column address of the first access address being asserted, and
   both the row indicator indicating a match and the column match indicator indicating a match,
   the multiple port SRAM is further characterized by:
      if the first access address and the second access address each correspond to a read access, the first read/write data line pair provides read data from the first bit cell, and the read data is provided to both the first port and the second port,
      if the first access address corresponds to a write access, the first port receives write data which is provided by the first read/write data line pair to the first bit cell and is provided to the second port as read data, and
      if the second access address corresponds to a write access, the first port receives write data which is provided by the first read/write data line pair to the first bit cell and is provided to the first port as read data.

11. The multiple port SRAM of claim 1, further comprising:
first row decode circuitry coupled to a first subset of the plurality of word lines, including the first word line, wherein the first row decode circuitry activates a word line of the first subset based on the first access address; and
second row decode circuitry coupled to a second subset of the plurality of word lines, including the second word line, wherein the first subset and the second subset are mutually exclusive.

12. The multiple port SRAM of claim 11, wherein:
when the row match indicator does not indicate a match, the second row decode circuitry activates a word line of the second subset based on the second access address, and
when the row match indicator indicates a match, the second row decode circuitry is disabled, in which the second word line is disabled.

13. The multiple port SRAM of claim 1, wherein, when the row match indicator does not indicate a match, the first plurality of read/write data line pairs accesses a first set of bit cells of the array of bit cells in response to the first access address, and the second plurality of read/write data line pairs accesses a second set of bit cells of the array of bit cells, mutually exclusive of the first set of bit cells, in response to the second access address.

14. The multiple port SRAM of claim 13, wherein the access of the first plurality of read/write data line pairs occurs simultaneously with the access of the second plurality of read/write data line pairs.

15. A method for accessing a multiple port static random access memory (SRAM) having a plurality of word lines, a plurality of bit line pairs, and a plurality of bit cells coupled to the plurality of word lines and the plurality of bit line pairs, wherein each of the plurality of bit cells is coupled to a first bit line pair and a second bit line pair of the plurality of bit line pairs and a first word line and a second word line of the plurality of word lines, the method comprising:
providing a first access address and a second access address to the multiple port SRAM;
providing a row match indicator based on a comparison between a row address of the first access address and a row address of the second access address, and providing a column match indicator based on a comparison between a column address of the first access address and a column address of the second access address; and
if the row match indicator indicates a match and the column match indicator does not indicate a match:
deactivating the second word line for each bit cell of the plurality of bit cells;
for each bit cell selected by the first access address, using a first read/write data line pair of the multiple port SRAM to access the bit cell selected by the first access address using the first bit line pair and the first word line,
for each bit cell selected by the second access address, using a second read/write data line pair of the multiple port SRAM to access the bit cell selected by the second access address using the first bit line pair and the first word line, and
decoupling the second read/write data line pairs from the second bit line pairs of the plurality of bit cells.

16. The method of claim 15, wherein, if the row match indicator does not indicate a match, the method comprises:
for each bit cell selected by the first access address, using the first read/write data line pair to perform a read or write access to the bit cell selected by the first access address using the first bit line pair and the first word line; and
for each bit cell selected by the second access address, using the second read/write data line pair to perform a read or write access the bit cell selected by the second access address using the second bit line pair and the second word line.

17. The method of claim 15, wherein, if both the row match indicator indicates a match and the column match indicator indicates a match, the method comprises:
if the first access address and the second access address each correspond to a read access, using the first read/write data line pair to access read data from bit cells selected by the first access address, and providing the read data as read data outputs at each of a first port and a second port of the multiple port SRAM;
if the first access address corresponds to a write access, receiving write data at the first port, providing the received write data as the read data output at the second port, and using the first read/write data line pair to store the received write data to bit cells selected by the first access address; and
if the second access address corresponds to a write access, receiving write data at the first port, providing the received write data as the read data output at the first port, and using the first read/write data line pair to store the received write data to bit cells selected by the first access address.

18. A multiple port static random access memory (SRAM) having a first port for receiving a first access address and a second port for receiving a second access address, the multiple port SRAM comprising:
a row match detector which provides a row match indicator based on whether a first row address derived from the first access address matches a second row address derived from the second access address;
a column match detector which provides a column match indicator based on whether a first column address derived from the first access address matches a second column address derived from the second access address;
a first bit cell having a first storage latch, and coupled to a first word line, a first true bit line, and a first complementary bit line to access the first storage latch, and coupled to a second word line, a second true bit line, and a second complementary bit line to access the first storage latch;
a second bit cell having a second storage latch, and coupled to the first word line, a third true bit line, and a third complementary bit line to access the second storage latch, and coupled to the second word line, a fourth true bit line, and a fourth complementary bit line to access the second storage latch;
a first data line pair, wherein the first true bit line and first complementary bit line is coupled to the first data line pair via first switching logic that is responsive to a first column decode signal generated from the first access address; and
a second data line pair, wherein the first true bit line and first complementary bit line is coupled to the first data line pair via second switching logic that is responsive to a first logical combination of a first column decode signal generated from the second access address, a row match indicator, and a column match indicator, and wherein the second true bit line and the second complementary bit line are coupled to the second data line pair via third switching logic that is responsive to a second logical combination of the first column decode signal generated from the second access address and the row match indicator.

19. The multiple port SRAM of claim 18, wherein:

the second switching logic connects the first true bit line and first complementary bit line to the second data line pair when the first column decode signal generated from the second access address is asserted, the row match indicator indicates a match, and the column match indicator does not indicate a match, and otherwise decouples the first true bit line and first complementary bit line from the second data line pair; and the third switching logic connects the second true bit line and the second complementary bit line to the second data line pair when the first column decode signal generated from the second access address is asserted and the row match indicator does not indicate a match, and otherwise decouples the second true bit line and the second complementary bit line from the second data line pair.

20. The multiple port SRAM of claim 19, wherein:

the first switching logic connects the first true bit line and the first complementary bit line to the first data line pair when the first column decode signal generated from the first access address is asserted, and decouples the first true bit line and the first complementary bit line from the first data line pair when the first column decode signal generated from the first access address is not asserted.

* * * * *